United States Patent [19]
Hirose et al.

[11] Patent Number: 4,688,904
[45] Date of Patent: Aug. 25, 1987

[54] REFLECTING OPTICAL SYSTEM

[75] Inventors: Ryusho Hirose, Kawasaki; Akiyoshi Suzuki, Tokyo, both of Japan

[73] Assignee: Canon Kabushiki Kaisha, Tokyo, Japan

[21] Appl. No.: 662,601

[22] Filed: Oct. 19, 1984

[30] Foreign Application Priority Data

Oct. 27, 1983 [JP] Japan ................ 58-201801

[51] Int. Cl.⁴ .............................. G02B 17/08
[52] U.S. Cl. .................................. 350/443
[58] Field of Search ............ 350/432, 443, 446

[56] References Cited

U.S. PATENT DOCUMENTS

4,293,186 10/1981 Offner ..................... 350/432

Primary Examiner—John K. Corbin
Assistant Examiner—Rebecca D. Gass
Attorney, Agent, or Firm—Fitzpatrick, Cella, Harper & Scinto

[57] ABSTRACT

A reflecting optical system including a concave mirror and a convex mirror having opposing reflecting surfaces and disposed coaxially with each other. The reflecting optical system is provided with aspherical lens portions disposed between an object field and the concave mirror and between the concave mirror and an image field, respectively, to achieve a wider superior imaging region of arcuate shape.

10 Claims, 25 Drawing Figures

REFLECTING OPTICAL SYSTEM

BACKGROUND OF THE INVENTION

This invention relates to a reflecting optical system suitable to be used as, for example, an optical system in a projection-type exposure apparatus, more particularly, in an alignment and exposure apparatus for manufacturing large scale integrated circuits, etc.

There have already been proposed various types of reflecting optical systems for use in the alignment and exposure apparatuses. For example, one comprises a concave mirror and a convex mirror which are disposed concentrically or eccentrically. Another reflecting optical system comprises a concave mirror and a convex mirror disposed substantially concentrically with each other and includes a meniscus lens and a chromatic aberration correcting mechanism.

In these reflecting optical systems for the alignment and exposure apparatuses, a superior imaging region is defined in an arcuate area spaced from the optical axis. An image of a part of a mask corresponding to the superior imaging region is formed on a wafer while, on the other hand, the mask and wafer are moved as a unit relative to the reflecting optical system so that the mask and wafer are slit-scanned whereby the image of the entire mask is formed on the wafer. In such reflecting optical systems, however, the width of the superior imaging region (the width of the scanning slit) is very narrow, for example of the order of 1 mm. Therefore, when they are applied to the alignment and exposure apparatuses, a longer scanning time, that is, a longer exposure time is required which results in a lower throughput of the wafer exposure per a unit time period.

SUMMARY OF THE INVENTION

It is a primary object of the present invention to provide a reflecting optical system which is free from the disadvantages peculiar to the conventional reflecting optical systems. More particularly, it is a principal object of the present invention to provide a reflecting optical system which enables enlargement of the superior imaging region (slit width) to thereby improve the throughput of the wafer exposure per unit time.

In summary, the present invention is based on the following finding:

As described above, the width of the superior imaging region and, therefore, the width of the scan slit in conventional reflecting optical systems are very narrow. This is because the reflecting optical system is arranged so that only a principal ray emitted from one or substantially one point on the object plane and travelling in parallel to the optical axis of the reflecting optical system is incident on the apex of the convex mirror (the intersection between the mirror surface and the optical axis). Such arrangement inherently involves substantial astigmatism. By this substantial astigmatism, the width of the superior imaging region (the width of scan slit) must be very narrow in order to maintain good resolution. The inventors have considered improvements or correction of the astigmatism and have conceived that, if all of the principal rays emitted from various object points, which are within a predetermined height range spaced from the optical axis of the reflecting optical system, and travelling in parallel to the optical axis are incident on the apex of the convex mirror, the astigmatism can be corrected and the superior imaging region of the reflecting optical system can be enlarged.

As will be described in more detail in the following part of the specification, the deflecting optical system according to the present invention includes first and second aspherical members as well as a concave mirror and a convex mirror. The first aspherical member is provided to direct the principal rays emitted from various object points, which are within a predetermined height range spaced from the optical axis of the reflecting optical system, and advancing in parallel to the optical axis to the apex of the convex mirror. The first aspherical member may be arranged so that, if there is a principal ray which can be incident on the apex of the convex mirror without the provision of the first aspherical member, the first aspherical member would not act on such principal ray. The second aspherical member is provided to act on the light which has been twice reflected by the concave mirror so that all the principal rays emitted from the apex of the convex mirror and then reflected by the concave mirror are directed to the image plane in a parallel relation relative to the optical axis of the reflecting optical system. With this arrangement, the astigmatism is well-corrected and the superior imaging region is enlarged.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
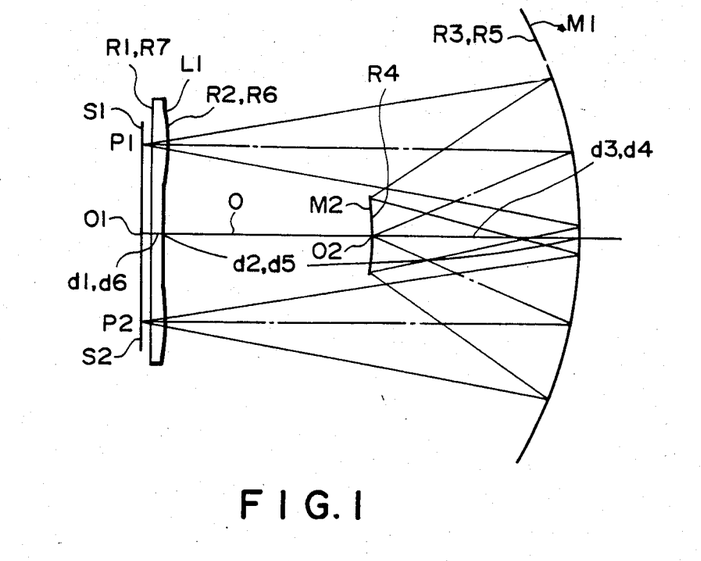
FIG. 1 shows the optical arrangement of a reflecting optical system according to one embodiment of the present invention.

Referring to FIG. 1 showing a first embodiment of the present invention, the reflecting optical system includes a concave mirror M1 and a convex mirror M2 having a radius of curvature smaller than that of mirror M1. These mirrors are disposed coaxially so that they have the same optical axis O. The centers of curvature of these mirrors are in the same direction so that the mirror surfaces are opposed to each other. An object plane S1 and an image plane S2 are in the same plane and are disposed symmetrically with each other with respect to a point O1 which is the intersection between the optical axis O and the plane containing the object plane S1 and the image plane S2.

The light beams emerging from the object plane S1 are reflected by the concave mirror M1 and then by the convex mirror M2 and again by the concave mirror M1. Thus, after having been subjected to reflection three times by the two mirrors M1 and M2, the object having a given height is imaged on the image plane S2 at a unit magnification, with the image of a point P1 being formed at the point P2. The convex mirror M2 functions also as an aperture stop of the reflecting optical system. Since the reflecting optical system is arranged symmetrically with respect to the center O2 of the effective diameter of the convex mirror M2, there would not occur any coma or distortion which are asymmetrical aberrations. However, astigmatism still remains. This problem is solved by the present invention.

In accordance with the present invention, there is provided an aspherical lens L1 shown in FIG. 1. An upper half of the aspherical lens is disposed between the object plane S1 and the convex mirror M2, while a lower half of the aspherical lens L1 is disposed between the convex mirror M2 and the image plane S2. The upper half and the lower half of the aspherical lens L1 have such shapes which are symmetric with each other with respect to the optical axis O. While in this embodiment, the aspherical lens L1 is shown as an integral member, it may be provided by separate elements.

In the reflecting optical system of the present invention, the astigmatism is corrected by the aspherical lens L1. In order to achieve this, the aspherical lens L1 is shaped so that all the principal rays emitted from the object points at the image heights within a predetermined area (correction area h shown in FIGS 2A to 2D) and travelling in parallel to the optical axis O are incident on the center or apex O2 of the convex mirror M2, while that all the principal rays reflected from the center O2 of the convex mirror M2 are incident on the image plane in parallel relation relative to the optical axis. FIGS. 2A-2D show various astigmatisms of the arrangements having different aspherical shapes.

Alternatively, the aspherical lens L1 may be shaped so that all the principal rays are incident on the mirror M2 surface at points slightly deviated from the center O2 or that a part of the principal rays are incident on the mirror M2 surface at points deviated from the center O2, unless the aberration is within a well-corrected range. Further, the aspherical lens L1 may be shaped so that all of or a part of the principal rays are incident on the image plane in a slightly non-parallel relation relative to the optical axis, unless the aberration is within a well-corrected range. In such cases as above, the part of the aspherical lens L1 on the object plane S1 side may be provided with an aspherical surface, while the part of the aspherical lens L1 on the image plane S2 side may be provided by a meniscus lens element. However, to provide both the upper and lower parts with aspherical surfaces is preferable because of ease of manufacture. For the sake of simplicity of description, the invention will be described with reference to the aspherical lens having aspherical surfaces formed on the upper and lower parts thereof.

In FIG. 1, the concave mirror M1 provides a convex lens action, that is, a converging action. This means that the concave mirror M1 causes a particular positive spherical aberration relative to a light beam incident on the mirror M1 surface at a particular height of incidence. Therefore, the aspherical lens L1 is arranged to provide, in accordance with such varying positive spherical aberration, caused by the concave mirror M1, with respect to the varying height of incidence corresponding to the varying image height within an arcuate correction area h (FIGS 2A to 2D), varying negative spherical aberration relative to the light beams, which are emitted from the object points at the object heights within an area corresponding to the correction area h and enters the aspherical lens L1. In other words, the shape of the aspherical lens L1 is selected so that, at every image height in the correction area h, the positive spherical aberration caused by the concave mirror M1 is cancelled by the negative spherical aberration of the aspherical lens L1. With such arrangement, all the principal rays parallel to the optical axis O which are emitted from the object heights and are to be incident on the image heights in the correction area h are incident on the center O2 of the reflecting optical system. That is, with respect to the image heights within the correction area h, the principal rays emitted from infinity are always incident on the center O2 of the optical system, and when this is achieved, the astigmatism of the reflecting optical system as a whole is corrected.

As is shown in FIGS. 2A to 2D, the correction area h is determined by the interrelation between the inclination of the sagittal image surface s, the inclination of the meridional image surface m and the permissible depth. Thus, the aspherical lens L1 is employed to correct the astigmatism, that is, to remove the astigmatic difference between the sagittal image surface s and the meridional image surface m, to thereby enlarge the correction area h and therefore the slit width.

In the first embodiment shown in FIG. 1, the concave mirror M1 and the convex mirror M2 are disposed eccentrically. The aspherical lens L1 comprises a gentle convex lens having an aspherical surface formed on its convex face opposed to the concave mirror M1. The aspherical surface area through which the principal rays corresponding to the correction area h pass is arranged to provide an increasing negative refracting power component as compared with that of the reference spherical surface, which component increases with the increase in the image height. The number of the aspherical lens is not limited to one, and plural aspherical lenses may be provided.

Figures 3, 4A, 4B, 4C, 4D:
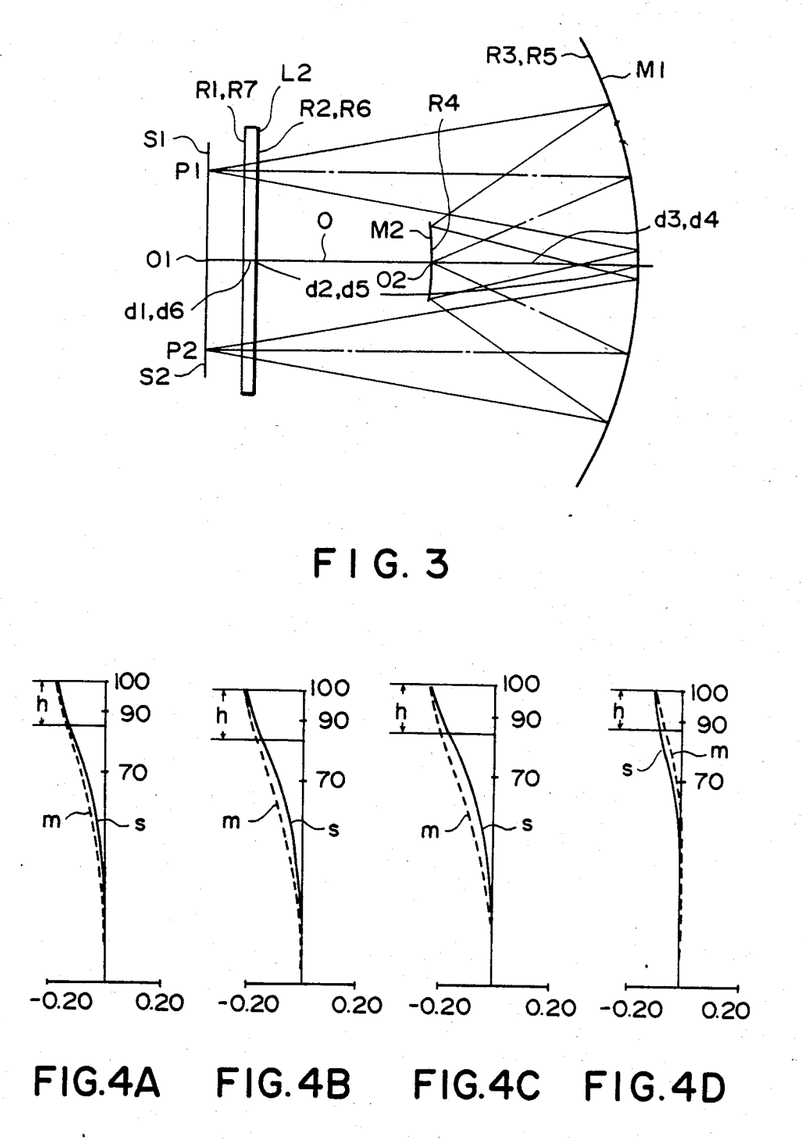
FIG. 3 shows the optical arrangement of a reflecting optical system according to a second embodiment of the present invention.
FIGS. 4A to 4D are views showing astigmatisms of the FIG. 3 embodiment.

FIG. 3 shows a reflecting optical system according to a second embodiment of the present invention and FIGS. 4A to 4D show the astigmatisms for different aspherical shapes. In this embodiment, elements having similar functions as of FIG. 1 embodiment are denoted by the same reference numerals. In FIG. 3, a concave mirror M1 and a convex mirror M2 are disposed concentrically. An aspherical lens L2 comprises a gentle convex lens having an aspherical surface formed on its convex face opposed to the object plane S1 and the image plane S2. The aspherical surface area through which the principal rays with respect to the image heights within the correction area h pass is arranged so that it provides an increasing negative refracting power component as compared with that of the reference spherical surface, which component increases with the increase in the image height, that is, the increase in the height of incidence on the concave mirror M1.

FIGS. 6A to 6D show a reflecting optical system according to a third embodiment of the present invention and FIG. 6 shows the astigmatisms for different aspherical shapes. In FIGS. 5 and 6A to 6D, the same reference characters denote elements or parts having similar functions as of those of FIG. 1 embodiment. The reflecting optical system comprises a concave mirror M1 and a convex mirror M2 which are disposed eccentrically. An aspherical lens L3 comprises a parallel flat plate having aspherical surfaces formed on the both sides thereof. Within a range through which the principal rays with respect to the image heights in the correction area h pass, the aspherical lens L3 is formed so that it provides a negative refracting power. This negative refracting power component increases with the increase in the image height.

Figure 7:
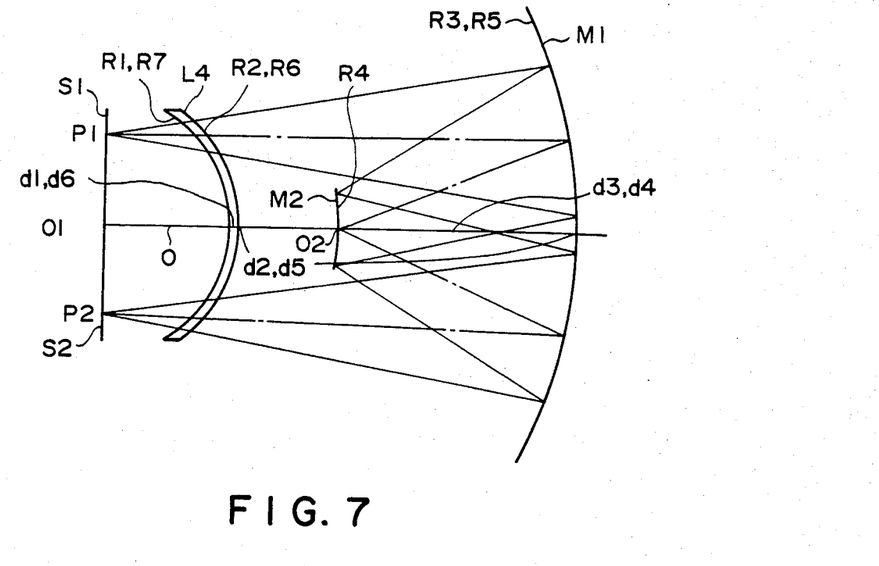
FIG. 7 shows the optical arrangement of a reflecting optical system according to a fourth embodiment of the present invention.

FIG. 7 shows a reflecting optical system according to a fourth embodiment of the present invention and FIGS. 8A to 8D show the astigmatisms for different aspherical shapes. Similarly, the same reference characters in FIGS. 7 and 8A to 8D denote elements or part having similar functions as of FIG. 1 embodiment. The reflecting optical system shown in FIG. 7 includes a concave mirror M1 and a convex mirror M2 which are disposed eccentrically. In order to cancel the aberrations caused by the positive or convex lens action of the concave mirror M1, there is provided an aspherical lens L4 which comprises a negative meniscus lens. The face of the lens L4 opposed to the concave mirror M1 is provided with an aspherical surface to remove or substantially eliminate the astigmatism within the correction area h. In this embodiment, the refracting power at the R1 face of the negative meniscus lens is greater than that of the concave mirror M1. In order to compensate for this, the shape of the aspherical surface portion of the aspherical lens L4 is such that the aspherical area on the R2 face is provided with a positive component as compared with that of the reference spherical surface.

Figure 8A:
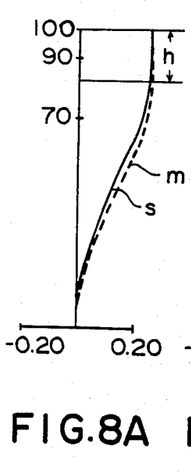
FIGS. 8A to 8D are views showing astigmatisms of the FIG. 7 embodiment.
Figure 8B:
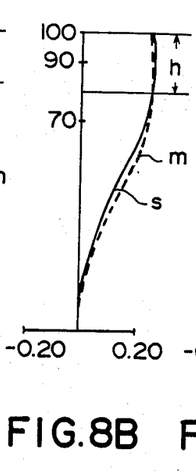
Figures 8C, 8D:
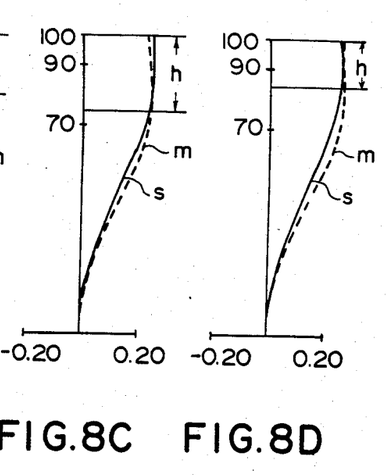
Figure 9:
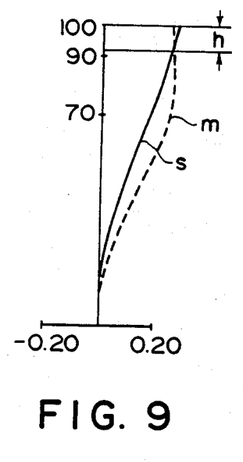
FIG. 9 is a view showing astigmatism of an arrangement which is the same as the FIG. 7 arrangement except that no aspherical surface is provided.

FIG. 9 shows the astigmatism of a reflecting optical system wherein a negative meniscus lens such as shown in FIG. 7 is provided but no aspherical surface is formed thereon. From FIG. 9, it is seen that the sagittal image surface s and the meridional image surface m are corrected as compared with a case where no meniscus lens is provided. However, when the FIG. 9 aberration is compared with the FIGS. 8A to 8D aberrations, it is apparent that the correction area h of FIG. 9 case is very narrow as compared with those of FIGS. 8A to 8D cases.

Numerical values of the optical arrangements of the first to fourth embodiments are shown in the following Tables 1-4, while the numerical values of the arrangement having no aspherical surface (FIG. 9 case) are shown in Table 5. In these tables, the reference character Ri designates the radius of curvature of the i-th of the surfaces of the optical elements in the order along the advancement of the light beam in FIGS. 1, 3, 5 and 7. The reference character di designates the thickness or air spacing, along the optical axis, of the i-th of the optical elements. The positive symbols and negative are are determined such that the direction from the left to the right is designated by the positive symbol.

TABLE 1

|  | R1 = ∞ | d1 = 14.65 | Fused Silica |
|---|---|---|---|
| *1 | R2 = −6882.06 | d2 = 488. | Air |
|  | R3 = −500. | d3 = −246.45 | Mirror |
|  | R4 = −247.37 | d4 = 246.45 | Mirror |
|  | R5 = −500. | d5 = −488. | Air |
| *1 | R6 = −6882.06 | d6 = −14.65 | Fused Silica |
|  | R7 = ∞ |  | Air |

In the above Table, the symbol "*" designates aspherical surfaces which are symmetrical with each other with respect to the optical axis and are deviated from the reference surface at a height h from the optical axis, by X which is given by:

$$X = [(h^2/R)/\{1 + \sqrt{1 - (h/R)^2}\}] + Bh^4 + Ch^6 + Dh^8 + Eh^{10}$$

The aspherical amount is designated by $\Delta S$.

Figure 2A:
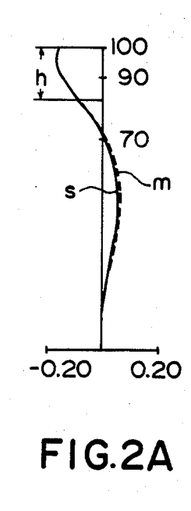
FIGS. 2A to 2D are views showing astigmatisms of the FIG. 1 embodiment.

(1) FIG. 2A Case

Figure 2B:
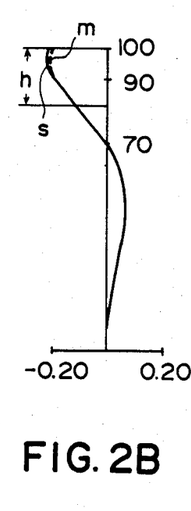

*1R = −6882.06
B = 4.59302·10$^{-8}$
C = −2.32609·10$^{-12}$
D = −1.19195·10$^{-18}$
E = 5.56425·10$^{-22}$
$\Delta S$ = 5.58·10$^{-2}$ (2) FIG. 2B Case

Figure 2C:
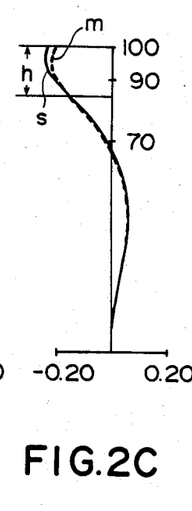

*1R = −6882.06
B = 4.73080·10$^{-8}$
C = −2.39587·10$^{-12}$
D = −1.22770·10$^{-18}$
E = 5.73117·10$^{-22}$
$\Delta S$ = 5.75·10$^2$ (3) FIG. 2C Case

Figure 2D:
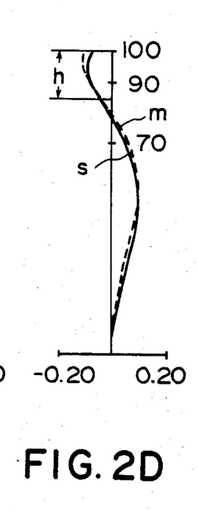

*1 R = −6882.06
B = 4.82267·10$^{-6}$
C = −2.44240·10$^{-12}$
D = −1.25155·10$^{-18}$
E = 5.84246·10$^{-22}$
ΔS = 5.86·10$^{-2}$ (4) FIG. 2D Case

*1 R = −6882.06
B = 4.36337·10$^{-8}$
C = −2.20978·10$^{-12}$
D = −1.13235·10$^{-18}$
E = 5.28603·10$^{-22}$
ΔS = 5.30·10$^{-2}$

TABLE 2

| | | | |
|---|---|---|---|
| *1 R1 = 3602.40 | d1 = 15. | Fused Silica |
| R2 = ∞ | d2 = 450. | Air |
| R3 = −500. | d3 = −244.844 | Mirror |
| R4 = −255.155 | d4 = 244.844 | Mirror |
| R5 = −500. | d5 = −450. | Mirror |
| R6 = ∞ | d6 = −15. | Fused Silica |
| *1 R7 = 3602.40 | | Air |

(1) FIG. 4A Case

*1 R = 3602.40
B = −1.47378·10$^{-8}$
C = 5.18559·10$^{-13}$
D = −2.02057·10$^{-18}$
E = 3.46421·10$^{-23}$
ΔS = 3.01·10$^{-2}$ (2) FIG. 4B Case

*1 R = 3602.40
B = −1.51799·10$^{-8}$
C = 5.34115·10$^{-13}$
D = −2.08118·10$^{-18}$
E = 3.56813·10$^{-23}$
ΔS = 3.10·10$^{-2}$ (3) FIG. 4C Case

*1 R = 3602.40
B = −1.54747·10$^{-8}$
C = 5.44486·10$^{-13}$
D = −2.12160·10$^{-18}$
E = 3.63742·10$^{-23}$
ΔS = 3.16·10$^{-2}$ (4) FIG. 4D Case

*1 R = 3602.40
B = −1.36324·10$^{-8}$
C = 4.79667·10$^{-13}$
D = −1.86903·10$^{-18}$
E = 3.20440·10$^{-23}$
ΔS = 2.80·10$^{-2}$

TABLE 3

| | | | |
|---|---|---|---|
| *1 R1 = ∞ | d1 = 15. | Fused Silica |
| *2 R2 = ∞ | d2 = 469.97 | Air |
| R3 = −500. | d3 = −244.844 | Mirror |
| R4 = −255.155 | d4 = 244.844 | Mirror |
| R5 = −500. | d5 = −469.97 | Mirror |
| *2 R6 = ∞ | d6 = −15. | Fused Silica |
| *1 R7 = ∞ | | Air |

Figure 6A:
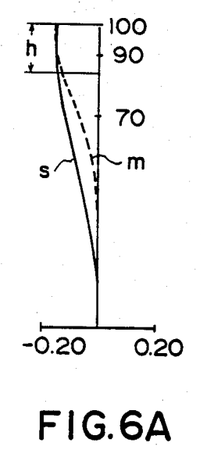
FIGS. 6A to 6D are views showing astigmatisms of the FIG. 5 embodiment.

(1) FIG. 6A Case

Figure 6B:
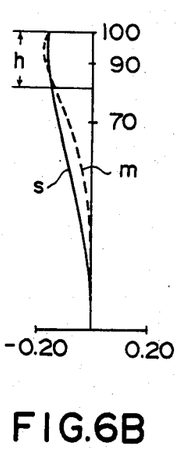

*1 R = ∞
B = 1.43677·10$^{-8}$
C = 5.16459·10$^{-13}$
D = 1.38587·10$^{-16}$
E = −1.48093·10$^{-20}$
ΔS = 5.25·10$^{-2}$
*2 R = ∞
B = 8.51816·10$^{-9}$
C = 2.05192·10$^{-12}$
D = −8.62761·10$^{-17}$
E = −3.58277·10$^{-21}$
ΔS = 4.93·10$^{-2}$ (2) FIG. 6B Case

Figure 6C:
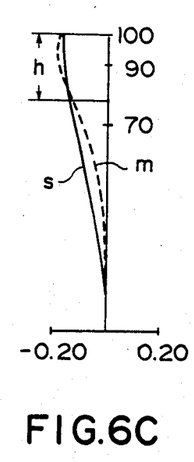

*1 R = ∞
B = 1.47980·10$^{-8}$
C = 5.31950·10$^{-13}$
D = 1.42744·10$^{-16}$
E = −1.52535·10$^{-20}$
ΔS = 5.43·10$^{-2}$
*2 R = ∞
B = 8.77370·10$^{-9}$
C = 2.11348·10$^{-12}$
D = −8.88643·10$^{-17}$
E = −3.69025·10$^{-21}$
ΔS = 5.10·10$^{-2}$ (3) FIG. 6C Case

Figure 6D:
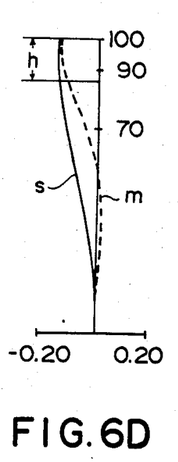

*1 R = ∞
B = 1.50853·10$^{-8}$
C = 5.42280·10$^{-13}$
D = 1.45516·10$^{-16}$
E = −1.55497·10$^{-20}$
ΔS = 5.55·10$^{-2}$
*2 R = ∞
B = 8.94407·10$^{-9}$
C = 2.15451·10$^{-12}$
D = −9.05899·10$^{-17}$
E = −3.76190·10$^{-21}$
ΔS = 5.21·10$^{-2}$ (4) FIG. 6D Case

*1 R = ∞
B = −1.36486·10$^{-8}$
C = 4.90636·10$^{-13}$
D = 1.31658·10$^{-16}$
E = −1.40688·10$^{-20}$
ΔS = 4.95·10$^{-2}$
*2 R = ∞
B = 8.09225·10$^{-9}$
C = 1.94932·10$^{-12}$
D = −8.19623·10$^{-17}$
E = −3.40363·10$^{-21}$
ΔS = 4.65·10$^{-2}$

TABLE 4

| | | | |
|---|---|---|---|
| R1 = −141.91 | d1 = 11.03 | Fused Silica |
| *1 R2 = −148.58 | d2 = 394.48 | Air |
| R3 = −551.15 | d3 = −279.07 | Mirror |
| R4 = −267.18 | d4 = 279.07 | Mirror |
| R5 = −551.15 | d5 = −394.48 | Mirror |
| *1 R6 = −148.58 | d6 = −11.03 | Fused Silica |
| R7 = −141.91 | | Air |

(1) FIG. 8A Case

*1 R = −148.58
B = −6.22051·10$^{-10}$
C = 1.08912·10$^{-13}$
D = −7.69172·10$^{-18}$
E = 2.41287·10$^{-22}$
ΔS = 1.98·10$^{-4}$ (2) FIG. 8B Case

*1 R = −148.58
B = −6.41775·10$^{-10}$
C = −7.92240·10$^{-13}$
D = −7.92240·10$^{-18}$
E = 2.48525·10$^{-22}$
ΔS = 2.03·10$^{-4}$ (3) FIG. 8C Case

*1 R = −148.58
B = −6.53152·10$^{-10}$
C = 1.14358·10$^{-13}$
D = 8.07631·10$^{-18}$
E = 2.53351·10$^{-22}$
ΔS = 2.08·10$^{-4}$

*1R = -148.58
B = -6.06498·10$^{-10}$
C = 1.06189·10$^{-13}$
D = -7.49900·10$^{-18}$
E = 2.35254·10$^{-22}$
ΔS = 1.93·10$^{-4}$

TABLE 5

| R1 = -141.91 | d1 = 11.03   | Fused Silica |
|--------------|--------------|--------------|
| R2 = -148.58 | d2 = 394.49  | Air          |
| R3 = -551.15 | d3 = -279.07 | Mirror       |
| R4 = -267.18 | d4 = 279.07  | Mirror       |
| R5 = -551.15 | d5 = -394.48 | Mirror       |
| R6 = -148.58 | d6 = -11.03  | Fused Silica |
| R7 = -141.91 |              | Air          |

Figure 10A:
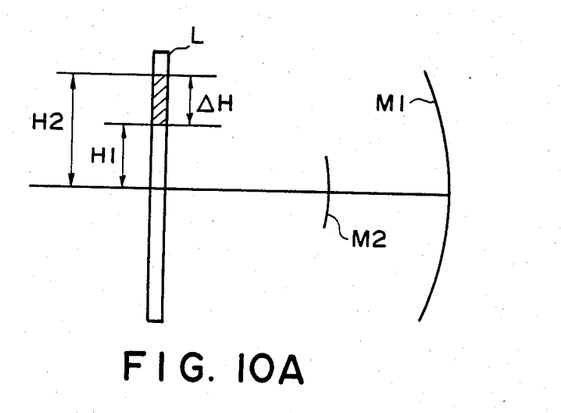
FIGS. 10A and 10B are views illustrating the aspherical amount $\Delta S$.
Figure 10B:
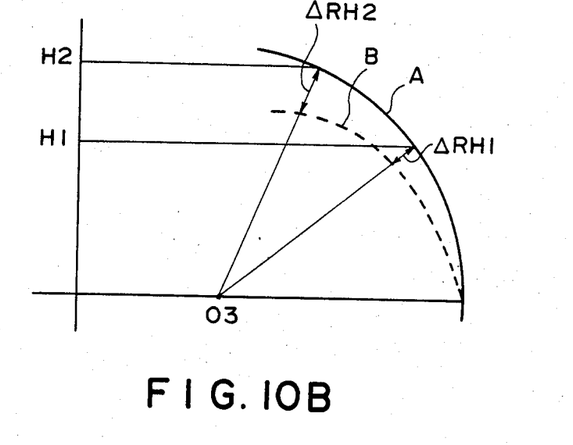

In this Specification, the aspherical amount ΔS is defined as follows:

$$\Delta S = (\Delta RH2 - \Delta RH1)/\Delta H$$

wherein ΔRH1 and ΔRH2 designate the amounts of aspherical deviation from the reference spherical surface at the heights H1 and H2, respectively (see FIGS. 10A and 10B). The value "ΔRH2−ΔRH1" is thus the aspherical deviation difference. In FIG. 10B, the solid line A shows the reference surface having a center O3, while the broken line B shows the aspherical surface.

In the above equation for the aspherical amount ΔS, the symbol "ΔH" designates the superior imaging region of arcuate shape (see FIG. 10A) defined by the range "H2-H1" and provided by the aspherical lens L.

It is seen from these tables that the aspherical amount ΔS is between 1/10$^4$ and 1/10 and that, when ΔS becomes smaller than 1/10$^4$, the change in the refracting power becomes small which diminishes the effect of aspherical surface. As the result, a wider slit width is no more obtainable. When, on the other hand, ΔS becomes greater than 1/10, the change in the refracting power becomes large so that the sagittal image surface s and the meridional image surface m are gradually separated from each other. As the result, a wider slit width is no more obtainable.

It is also seen from these tables that the permissible range of the aspherical amount ΔS varies depending on the dimension of the reference spherical surface. That is, when the reference spherical surface |R| is greater than 1000 mm, ΔS lies between 1/10$^3$ and 1/10. If the lower limit value or upper limit value is exceeded, there would occur similar disadvantages as described in the foregoing. Further, when the reference spherical surface |R| is not greater than 200 mm, ΔS lies between 1/10$^4$ and 1/10$^3$. When the lower limit value or upper limit value is exceeded, similar disadvantages would occur.

It is preferable that the Abbe's number ν of the glass constituting the aspherical lens L1, L2, L3 or L4 satisfies the following condition:

$$60 > \nu > 100$$

When the Abbe's number ν is smaller than 60, there would occur substantial chromatic aberration which remarkably limits the usable wavelength regions. An optical glass having an Abbe's number ν which is greater than 100 does not exist at present.

In each of the above-described embodiments, the concave mirror M1 and the convex mirror M2 are disposed coaxially with each other. If, in such reflecting optical systems, no aspherical lens is provided, the principal ray which is emitted from an object point located at a predetermined object height H0 and travels in parallel to the optical axis O is reflected by the concave mirror M1 and is incident on the apex of the convex mirror M2 which is the intersection between the mirror M2 surface and the optical axis O. The principal ray reflected from the apex of the convex mirror M2 is reflected again by the concave mirror M1 and is directed to the image plane in a parallel relation relative to the optical axis. Accordingly, this optical system is telecentric on both the entrance side and the exit side. In the foregoing embodiments, the above-mentioned point H0 is located at the height H1 (FIGS. 10A and 10B) or at a height lower than the height H1. For this reason, the aspherical lens is arranged to have an increasing negative refracting power component which increases with the increase in the distance from the optical axis, as has hitherto been described.

In accordance with the present invention as described in the foregoing, the reflecting optical system is provided with an aspherical lens by which the sagittal image surface s and the meridional image surface m with respect to the image heights within the correction area are superposed on one another in a wider range. This enables enlargement of the superior imaging region. The enlargement of the superior imaging region, i.e. the enlargement of the slit width advantageously reduces the exposure time. Particularly, the aspherical lens is not limited to be disposed concentrically with the concave mirror M1 and convex mirror M2. In contradistinction to a lens system formed only by the spherical surfaces, location of the aspherical lens is not restricted. An adequate consideration for the correction by the aspherical surface is sufficient. Accordingly, a reflecting optical system having a higher performance can be easily achieved. The experimental results showed enlargement of the superior imaging region wherein the image height region h (correction area) could be from 100 to 90 mm, namely, the slit width could be approx. 10 mm.

Figure 11:
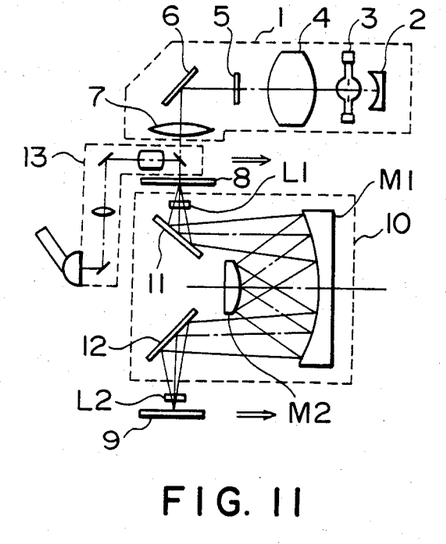
FIG. 11 shows the optical arrangement of an alignment and exposure apparatus in which a reflecting optical system according to the present invention is incorporated.
Figure 12:
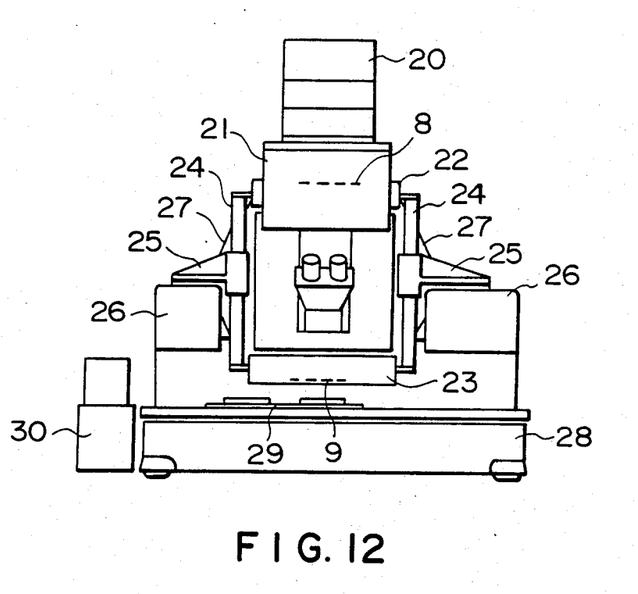
FIG. 12 is a front elevational view of the exposure apparatus of FIG. 11.

A semiconductor exposure apparatus having a reflecting optical system according to the present invention is illustrated in FIGS. 11 and 12. Referring first to FIG. 11 showing the optical arrangement of the exposure apparatus, there is provided a mask illuminating optical system for illuminating the mask 8. The illuminating optical system includes a spherical mirror 2, a light source 3 such as an arcuate Hg lamp, a lens 4, a filter 5, a 45-degree mirror 6 and a lens 7 which are disposed along the otical axis of the illuminating optical system. The filter 5 is provided to remove the light component to which a wafer 9 is sensitive, and is adapted to be inserted into the path of the illuminating light during an alignment operation for the mask and wafer. The illuminating optical system 1 is adapted to provide an illumination area of arcuate shape for the mask 8, so that the reflecting optical system defines an imaging area of arcuate shape. The mask 8 is disposed horizontally and is held by an unshown mask holder of known type. Below the mask 8, there is provided a reflecting optical system 10 according to the present invention for forming the image of the mask 8 on the wafer 9. The reflecting optical system 10 includes a concave mirror M1 and a convex mirror M2, as in the foregoing embodiments. Aspherical lenses L1 and L2 have similar functions as of the corresponding elements of the foregoing embodiments. However, the aspherical lenses L1 and L2 are separated from each other, one (L1) for the object plane (mask 8) and the other (L2) for the image plane (wafer 9), as compared with the foregoing embodiments. The reflecting optical system 10 further includes mirrors 11 and 12 for deflecting the light from the aspherical lens L1 and the light to the aspherical lens L2, respectively. The wafer 9 is held by an unshown wafer holder of known type which is movable for fine adjustment in X, Y and $\theta$ directions.

During alignment operation, a microscopic optical system 13 is inserted between the illuminating optical system 1 and the mask 8 to discriminate whether or not the mask 8 and wafer 9 are in a predetermined positional relation. If the mask 8 and wafer 9 is out of the predetermined positional relation, the wafer holder is adjusted in the X, Y and/or $\theta$ direction so that the wafer 9 is moved relative to the mask 8 until the predetermined positional relation is achieved.

FIG. 12 shows the external view of the exposure apparatus. In FIG. 12, a lamp housing 20 accommodates the illumination optical system 1 shown in FIG. 11. A unit 21 accommodates the alignment microscopic optical system 13 and is arranged for back and forth movement. The exposure apparatus further includes a mask supporting member 22 and a wafer supporting member 23 which are connected to each other by connecting members 24 so that the supporting members 22 and 23 can be moved as a unit. While the supporting members 22 and 23 are movable as a unit, the wafer 9 is movable relative to the supporting member 23 for fine adjustment. Fixed to each connecting member 24 is an arm 25 which is supported by a guide 26. The guide 26 includes a horizontally moving mechanism by which the supporting members 22 and 23 are moved horizontally as a unit. The exposure apparatus further comprises a barrel portion 27 accommodating the reflecting/imaging optical system, a base 28, a turn table 29 and a automatic feeder 30. By this automatic feeder 30, the wafer 9 is automatically fed to the wafer supporting member 23 through the turn table 29.

In operation of the exposure apparatus, the relative positional relation between the mask 8 and wafer 9 is first adjusted to provide alignment therebetween. During this alignment operation, the filter 5 is inserted into the path of the illumination light of the illuminating optical system 1, and the lenses 4 and 7 form on the mask 8 an arcuate image of the light source, the image being provided by the light to which the wafer 9 is insensitive. Simultaneously therewith, the microscopic optical system 13 is also inserted between the lens 7 and the mask 8. Alignment marks formed on the mask 8 and wafer 9 are observed through the microscopic optical system 13, and the positional relation between these alignment marks is adjusted by operating the wafer supporting member 23. After completion of the alignment between the mask 8 and wafer 9, the filter and the microscopic optical system 13 are moved out of the optical path. At the same time, the light source 3 is turned off or is blocked by an unshown shutter mechanism. Subsequently, the light source 3 is turned on or the shutter mechanism for the light source 3 is released, whereby an arcuate image of the light source is formed on the mask 8 by the light to which the wafer 9 is sensitive. Simultaneously therewith, the arm 25 starts to move the guide 26 horizontally. By this horizontal movement, the image of the entire mask 8 is formed or printed on the wafer 9.

While the invention has been described with reference to the structures disclosed herein, it is not confined to the details set forth and this application is intended to cover such modifications or changes as may come within the purposes of the improvements or the scope of the following claims.

What is claimed is:

1. A reflecting optical system comprising:
   a concave mirror for receiving light beams emitted from a predetermined area of an object field which is within a predetermined range of height from the optical axis of said concave mirror;
   a convex mirror disposed coaxially with said cocave mirror relative to the optical axis thereof, for receiving the light beams reflected from said concave mirror and for reflecting the light beams back to said concave mirror;
   a first aspherical member, disposed in a path of the light beams travelling from the object filed to said cocave mirror, for directing principal rays emitted from points of the object field and travelling in parallel to the optical axis to an intersection between said convex mirror and the optical axis after the light beams are first reflected by said concave mirror; and
   a second aspherical member disposed in a path of the light beams reflected twice by said concave mirror, for directing the principal rays reflected from said intersection between said convex mirror and the optical axis to an image field in parallel relation to the optical axis; said system satisfying the following conditions:

$$1/10^4 \leq |(\Delta RH2 - \Delta RH1)/\Delta H| \leq 1/10$$

where $\Delta H$ is th region of the object field defined between a height H1 from the optical axis and a height H2 which is greater than H1, and where $\Delta RH1$ and $\Delta RH2$ are the amount of aspherical deviation at the heights H1 and H2 from the optical axis, respectively, when the aspherical deviation, from a reference spherical surface, of at least one of said first and said second aspherical members in the direction in which the negative refracting power increases is designated by a positive symbol.

2. A reflecting optical system according to claim 1, wherein each of said first and second aspherical members has a negative refracting power component which increases with the increase in the distance from the optical axis.

3. A reflecting optical system according to claim 1, wherein said first aspherical member has the same aspherical surface shape as said second aspherical member and wherein said first and second aspherical members are disposed symmetrically with each other with respect to the optical axis.

4. A reflecting optical system according to claim 1, wherein said first and second aspherical members are provided by portions of an integral aspherical lens.

5. A reflecting optical system according to claim 2, wherein at least one of said first and said second aspherical members is made of a glass having an Abbe's number $\nu$ which satisfies the following condition:

$$60 < \nu < 100.$$

6. A reflecting optical system comprising:
a concave mirror for receiving light beams emitted from a predetermined area of an object field which is within a predetermined range of height from the optical axis of said concave mirror;
a convex mirror disposed coaxially with said concave mirror relative to the optical axis thereof, for receiving the light beams reflected from said concave mirror and for reflecting the light beams back to said concave mirror;
a first aspherical member, disposed in a path of the light beams travelling from the object field to said concave mirror, for directing principal rays emitted from points of the object field and travelling in parallel to the optical axis to an intersection between said convex mirror and the optical axis after the light beams are first reflected by said concave mirror and;
a second aspherical member disposed in a path of the light beams reflected twice by said concave mirror, for directing the principal rays reflected from said intersection between said convex mirror and the optical axis to an image field in parallel relation relative to the optical axis;
at least one of said first and said second aspherical members comprising a lens which is provided with an aspherical surface and wherein said system satisfies the following conditions:

$$|R| > 1000$$

$$1/10^3 < |(\Delta RH2 - \Delta RH1)/\Delta H| < 1/10$$

where R is the radius of curvature of said lens surface, $\Delta H$ is the region of the object field defined between a height H1 from the optical axis and as height H2 which is greater than H1, and $\Delta RH1$ and $\Delta RH2$ are the amounts of aspherical deviation, from a reference spherical surface, of said aspherical surface at the heights H1 and H2 from the optical axis.

7. A reflecting optical system according to claim 6, wherein said first aspherical member has the same aspherical surface shape as said second aspherical member and wherein said first and second aspherical members are disposed symmetrically with each other with respect to the optical axis.

8. A reflecting optical system according to claim 6, wherein said first and second aspherical members are provided by portions of an integral aspherical lens.

9. A reflecting optical system according to claim 6, wherein each of said first and second aspherical members has a negative refracting power component which increases with the increase in the distance from the optical axis.

10. A reflecting optical system according to claim 9, wherein said first or second aspherical member is made of a glass having an Abbe's number $\nu$ which satisfies the following condition:

$$60 < \nu < 100.$$

* * * * *

UNITED STATES PATENT AND TRADEMARK OFFICE
CERTIFICATE OF CORRECTION

PATENT NO. : 4,688,904
DATED : August 25, 1987
INVENTOR(S) : RYUSHO HIROSE, ET AL It is certified that error appears in the above-identified patent and that said Letters Patent is hereby corrected as shown below:

COLUMN 1

Line 36,   "a" should be deleted.

COLUMN 3

Line 63,   "that" should be deleted.
    Line 66,   "FIGS. 2A-2D" should read --FIGS. 2A to 2D--.

COLUMN 4

Line 40,   "enters" should read --enter--.

COLUMN 5

Figure 5:
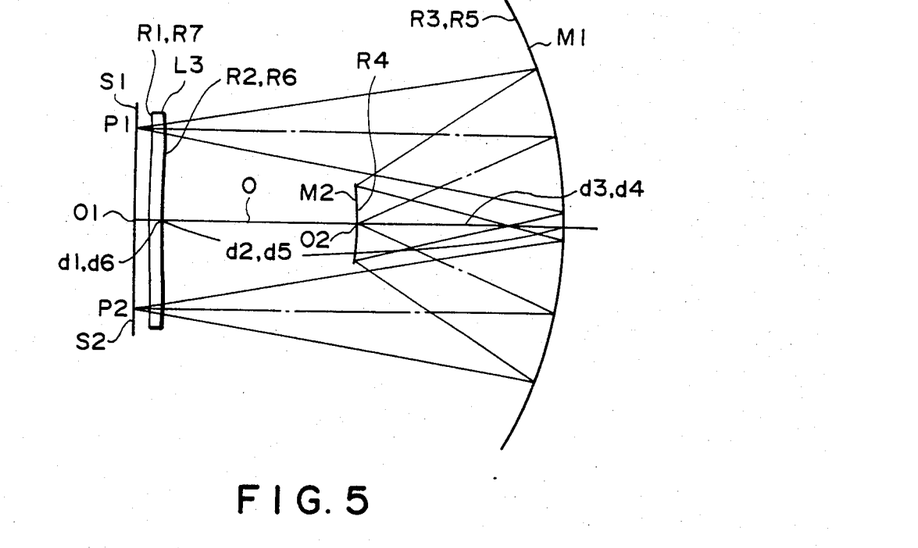
FIG. 5 shows the optical arrangement of a reflecting optical system according to a third embodiment of the present invention.

Line 33,   "FIGS. 6A to 6D show" should read --FIG. 5 shows--.
    Line 35,   "FIG. 6 shows" should read --FIGS. 6A to 6D show--.
    Line 54,   "part" should read --parts--.

COLUMN 6

Line 30,   "symbols and negative are" should read --and negative symbols--.
    Line 67,   "$\Delta S = 5.75 \cdot 10^2$" should read --$\Delta S = 5.75 \cdot 10^{-2}$--.

COLUMN 7

Line 12,   "$D = -1.13235 \cdot ^{-18}$" should read --$D = -1.13235 \cdot 10^{-18}$--.

UNITED STATES PATENT AND TRADEMARK OFFICE
CERTIFICATE OF CORRECTION

PATENT NO. : 4,688,904
DATED : August 25, 1987
INVENTOR(S) : RYUSHO HIROSE, ET AL It is certified that error appears in the above-identified patent and that said Letters Patent is hereby corrected as shown below:

COLUMN 7

Line 70, "$D=-8.62761 \cdot 10^{-17}$" should be inserted.
$E=-3.58277 \cdot 10^{-21}$
$\Delta S=4.93 \cdot 10^{-2}$

COLUMN 8

Line 70, "$D=8.07631 \cdot 10^{-18}$" should read --$D=-8.07631 \cdot 10^{-18}$--.

COLUMN 9

Line 2, "(4) FIG. 8D Case" should be inserted.

COLUMN 10

Line 63, "otical" should read --optical--.

COLUMN 11

Line 55, "turn table" should read --turntable--.
Line 55, "a" (third occurrence) should read --an--.
Line 57, "turn table" should read --turntable--.

COLUMN 12

Line 8, "filter and" should read --filter 5 and--.
Line 34, "cocave" should read --concave--.
Line 40, "filed" should read --field--.
Line 41, "cocave" should read --concave--.

UNITED STATES PATENT AND TRADEMARK OFFICE
CERTIFICATE OF CORRECTION

PATENT NO. : 4,688,904
DATED : August 25, 1987
INVENTOR(S) : RYUSHO HIROSE, ET AL It is certified that error appears in the above-identified patent and that said Letters Patent is hereby corrected as shown below:

COLUMN 12

Lines 48-51, The left margin should be indented.
Line 54, "$1/10^4 \leq |(\Delta RH2-\Delta RH1) \Delta H \leq 1/10$" should read --$1/10^4 \leq |(\Delta RH2-\Delta RH1)/\Delta H| \leq 1/10$--.

Line 56, "th" should read --the--.

COLUMN 13

Line 38, "mirror and;" should read --mirror; and--.

COLUMN 14

Line 14, "as" should read --a--.

Signed and Sealed this

Sixteenth Day of February, 1988

Attest:

DONALD J. QUIGG

Attesting Officer

Commissioner of Patents and Trademarks